(12) United States Patent
Luo

(10) Patent No.: US 12,532,507 B2
(45) Date of Patent: Jan. 20, 2026

(54) THIN FILM TRANSISTOR ARRAY SUBSTRATE AND DISPLAY PANEL

(71) Applicant: SHENZHEN CHINA STAR OPTOELECTRONICS SEMICONDUCTOR DISPLAY TECHNOLOGY CO., LTD., Guangdong (CN)

(72) Inventor: Chuanbao Luo, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 628 days.

(21) Appl. No.: 17/898,554

(22) Filed: Aug. 30, 2022

(65) Prior Publication Data
US 2024/0055530 A1    Feb. 15, 2024

(30) Foreign Application Priority Data
Aug. 11, 2022  (CN) .......................... 202210961795.7

(51) Int. Cl.
*H01L 29/66*    (2006.01)
*H01L 25/16*    (2023.01)
(Continued)

(52) U.S. Cl.
CPC ....... *H10D 30/6723* (2025.01); *H01L 25/167* (2013.01); *H10D 99/00* (2025.01);
(Continued)

(58) Field of Classification Search
CPC ...... H10D 86/441; H10D 86/40; H10D 86/60; H10D 86/421; H10D 30/6723; H10D 30/67; H10D 30/6755; H10D 99/00; H10H 20/852; H10H 20/854; H10H 29/142; H10H 29/10; H10H 20/857; H01L 25/167; H01L 25/16; H01L 25/0753

See application file for complete search history.

(56) References Cited

U.S. PATENT DOCUMENTS 11,049,975 B2 *  6/2021  Qu ..................... H10D 30/6734
12,183,249 B2    12/2024  Chen et al.
(Continued)

FOREIGN PATENT DOCUMENTS

CN    104752477    *  7/2015    ............. H01L 27/32
CN    112038325       12/2020
(Continued)

OTHER PUBLICATIONS

Notification of Office Action and Search Report Dated Feb. 18, 2025 From The State Intellectual Property Office of the People's Republic of China Re. Application No. 202210961795.7 and Its Translation Into English. (13 Pages).

*Primary Examiner* — Nikolay K Yushin

(57) ABSTRACT

A thin film transistor array substrate and a display panel are provided. The array substrate includes a substrate, a first metal layer, a first buffer layer, a second metal layer, a second buffer layer, an active layer, a gate insulating layer, a third metal layer, a passivation layer, and a fourth metal layer. By arranging the fourth metal layer on the passivation layer, an influence of water vapor in the environment on the array substrate is blocked, thereby improving a product yield and a reliability of the display panel.

15 Claims, 3 Drawing Sheets

(51) Int. Cl.
*H10D 30/67* (2025.01)
*H10D 99/00* (2025.01)
*H10D 86/40* (2025.01)
*H10D 86/60* (2025.01)

(52) U.S. Cl.
CPC ....... *H10D 30/6755* (2025.01); *H10D 86/441* (2025.01); *H10D 86/60* (2025.01)

(56) References Cited

U.S. PATENT DOCUMENTS 12,185,597 B2    12/2024   Ke
2020/0287052 A1*  9/2020   Qu .................. H10K 59/131

FOREIGN PATENT DOCUMENTS

| CN | 113327936 | 8/2021 |
| CN | 114883360 | 8/2022 |

* cited by examiner

S101 providing a semiconductor structure, wherein the semiconductor structure includes a substrate, a first metal layer stacked on the substrate, a first buffer layer, a source electrode, a drain electrode, a second buffer layer, an active layer, a gate insulating layer, a gate electrode, and a passivation layer

S102 forming a fourth metal material layer on the passivation layer, and patterning the fourth metal material layer to form a fourth metal layer, wherein a projection of the gate electrode on the substrate is positioned in a projection of the fourth metal layer on the substrate

FIG. 1

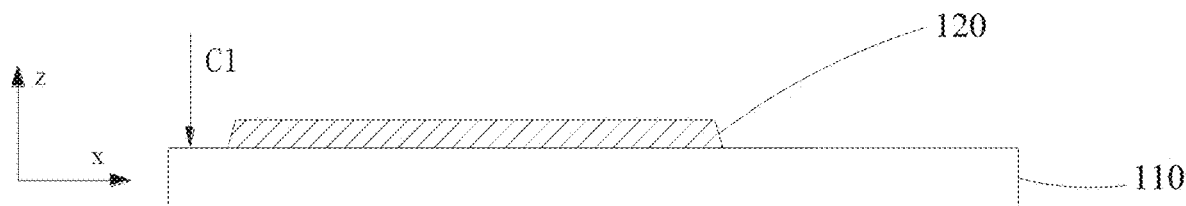

FIG. 2a

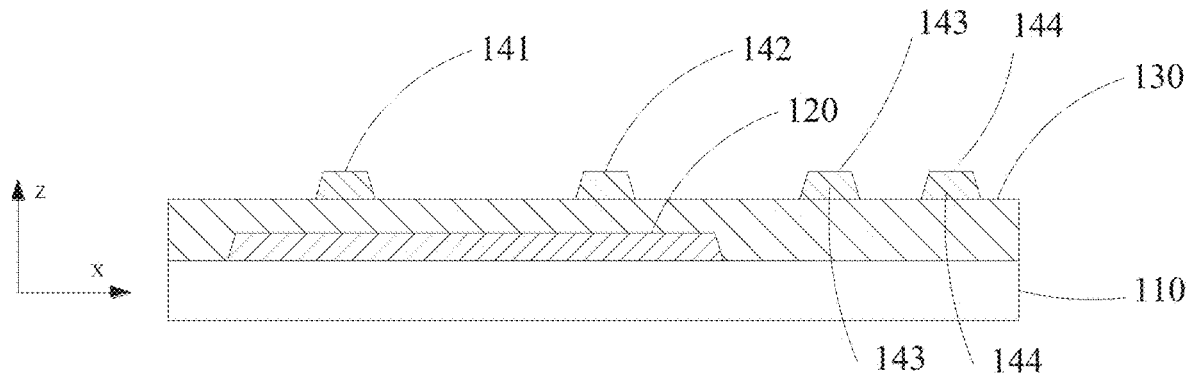

FIG. 2b

THIN FILM TRANSISTOR ARRAY SUBSTRATE AND DISPLAY PANEL

RELATED APPLICATIONS

This application claims the benefit of priority of Chinese Patent Application No. 202210961795.7 filed on Aug. 11, 2022, the contents of which are incorporated by reference as if fully set forth herein in their entirety.

FIELD OF INVENTION

The present application relates to a field of display technology, and in particular, to a thin film transistor array substrate and a display panel.

BACKGROUND OF INVENTION

Mini/Micro-LED (MLED) display technology has entered a stage of accelerated development in the past two years, and can be used in medium and small high-value-added display applications. Compared with OLED screens, MLED displays show better performance in terms of cost, contrast ratio, high brightness, and have thin and light characteristics. In the MLED display technology, the array substrate technology is a key technology for controlling the MLED display. In general, the current array substrate used for controlling MLED displays adopts 10mask technology, which greatly increases a cost of the array substrate and is not conducive to a mass production of MLED display technology. Masks can be saved by patterning some structures together.

However, the current mask-reducing array substrates are prone to some problems. For example, the mask reduction technology usually involves forming metal layers positioned in different layers in the array substrate through a same mask. Correspondingly, the metal layers originally positioned in different layers are set in a same layer, which reduces a non-destructive effect of separating the metal layers. The metal film layer reduces an ability of the array substrate to isolate water and oxygen.

Therefore, the currently technology has defects and needs to be improved and developed.

SUMMARY OF INVENTION

The present application provides a thin film transistor array substrate and a display panel, to improve the water and oxygen isolation capability of the array substrate, thereby improving a product yield and a reliability of the panel.

In order to solve the above problems, the present application provides a substrate;
a first metal layer formed on a first surface of the substrate;
a first buffer layer formed on a side of the first metal layer away from the first surface;
a second metal layer formed on the first buffer layer, wherein the second metal layer forms a source electrode and a drain electrode of the thin film transistor;
a second buffer layer formed on the second metal layer;
an active layer formed on the second buffer layer, wherein the active layer includes a channel layer, and a first conductor layer and a second conductor layer on both sides of the channel layer;
a gate insulating layer formed on the active layer, and a third metal layer formed on the gate insulating layer, wherein the third metal layer forms a gate electrode of the thin film transistor;
a passivation layer formed on the third metal layer; and
a fourth metal layer formed on the passivation layer.

In one embodiment of the present application, the fourth metal layer is electrically connected to the first metal layer.

In one embodiment of the present application, the thin film transistor array substrate further includes:
an opening penetrating through the passivation layer, the second buffer layer, and the first buffer layer, wherein the opening extends to a side of the first metal layer facing away from the first surface; and
a connection electrode formed in the opening;
wherein the fourth metal layer is connected to the first metal layer through the connection electrode.

In one embodiment of the present application, at least one of the thin film transistors includes the connection electrode, wherein the connection electrode at least includes:
a first connection electrode positioned on a source electrode side; and
a second connection electrode positioned on a drain electrode side;
wherein the fourth metal layer is connected to the first metal layer through the first connection electrode and the second connection electrode, to surround the source electrode, the drain electrode, and the gate electrode.

In one embodiment of the present application, as in any of the above thin film transistor array substrates, the thin film transistor array substrate further includes a first through hole and a second through hole penetrating the second buffer layer;
wherein the first through hole and the second through hole respectively exposing the source electrode and the drain electrode, wherein the first conductor layer is connected to the source electrode through the first through hole, and wherein the second conductor layer is connected to the drain electrode through the second through hole.

In one embodiment of the present application, as in any of the above thin film transistor array substrates, a projection of the first metal layer on the substrate completely covers a projection of the active layer on the substrate, wherein a projection of the fourth metal layer on the substrate completely covers the projection of the first metal layer on the substrate.

In one embodiment of the present application, a number of the thin film transistors is plural, wherein the plurality of thin film transistors distributed along an extending direction of the scanning line of the gate electrode share the fourth metal layer, and/or share the first metal layer.

In one embodiment of the present application, the plurality of the connection electrodes corresponding to the adjacent thin film transistors distributed along the extending direction of the scanning line of the gate electrode are staggered and distributed along the extending direction of the scanning line of the gate electrode.

In order to solve the above problems, the present application also provides a display panel, the display panel includes a display device and a thin film transistor array substrate as described above, and the thin film transistor array substrate further including a first electrode and a second electrode formed by the second metal layer.

In one embodiment of the present application, the display device includes a mini-LED device and/or a micro-LED device, wherein one terminal of the mini-LED device and/or one terminal of the micro-LED device is connected to the first electrode, and wherein the other terminal of the mini-LED device and/or the other terminal of the micro-LED device is connected to the second electrode.

The beneficial effects of the present application are: Different from the prior art, the present application provides a thin film transistor array substrate and a display panel are provided. The array substrate includes a substrate, a first metal layer formed on a first surface of the substrate, a first buffer layer formed on a side of the first metal layer away from the first surface, a second metal layer formed on the first buffer layer, wherein the second metal layer forms the source electrode and the drain electrode of the thin film transistor, a second buffer layer formed on the second metal layer, an active layer formed on the second buffer layer, wherein the active layer includes a channel layer, and a first conductor layer and a second conductor layer on both sides of the channel layer; a gate insulating layer formed on the active layer, and a third metal layer formed on the gate insulating layer, wherein the third metal layer forms a gate electrode of the thin film transistor, a passivation layer formed on the third metal layer, and a fourth metal layer formed on the passivation layer. By arranging the fourth metal layer on the passivation layer, an influence of water vapor in the environment on the array substrate is blocked, thereby improving a product yield and a reliability of the panel.

DESCRIPTION OF FIGURES

FIG. 1 is a schematic flowchart of an array substrate provided in one embodiment of the present application.

FIGS. 2a to 2f are schematic structural diagrams corresponding to each step in the manufacturing method provided in the embodiment of the present application.

DETAILED DESCRIPTION OF EMBODIMENTS

Figure 2C:
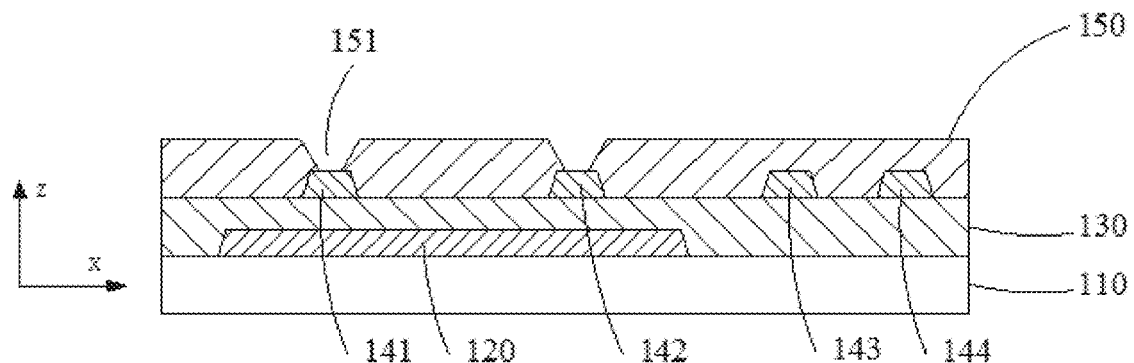

The present application will be further described in detail below with reference to the accompanying figures and embodiments. It is particularly pointed out that the following examples are only used to illustrate the present application, but do not limit the scope of the present application. For example, the following embodiments are only some but not all of the embodiments of the present application, and all other embodiments obtained by those of ordinary skill in the art without inventive step fall within a protection scope of the present application.

Furthermore, the terms first, second, third, etc. mentioned herein may be used herein to describe various elements, but these elements should not be limited by these terms. These terms are only used to distinguish these elements from each other. For example, a first type could be termed a second type, and, similarly, a second type could be termed the first type, without departing from a scope of the present application. Therefore, the terms used are for describing and understanding the present application, not for limiting the present application. In the various figures, structurally similar elements are designated by the same reference numerals. For the sake of clarity, various parts in the figures have not been drawn to scale. Furthermore, some well-known parts may not be shown in the figures.

In addition, in each of the figures, structurally similar elements are denoted by the same reference numerals. When one component is described as being "connected" to another component, both can be understood as being "directly connected to", or one component being "indirectly connected to" the other component through an intervening component.

In order to make the objectives, technical solutions and advantages of the present application clearer, the present application will be further described in detail below with reference to the accompanying figures.

As shown in FIG. 1, the present application provides a method of manufacturing a thin film transistor array substrate. The method of manufacturing the array substrate is compared with the structural diagrams of FIGS. 2a to 2f, and the specific processes are as follows:

Step S101: providing a semiconductor structure (not shown in the figure), wherein the semiconductor structure includes a substrate 110, a first metal layer 120 stacked on the substrate 110, a first buffer layer 130, a source electrode 141 and a drain electrode 142, a second buffer layer 150, an active layer 160, a gate insulating layer 171, a gate electrode 172, and a passivation layer 180.

The source electrode 141 and the drain electrode 142 are provided in a same layer.

Step S101: providing a semiconductor structure, which specifically includes:

Step S1011: providing the substrate 110;

Step S1012: forming a first metal material layer on the substrate 110, and patterning the first metal material layer to form the first metal layer 120;

Step S1013: sequentially forming the first buffer layer 130 and the second metal layer on the first metal layer 120, and patterning the second metal layer to form the source electrode 141 and the drain electrode 142;

Step S1014: forming the second buffer layer 150 on the second metal layer (not shown in the figure);

Step S1015: forming the active layer 160 on the second buffer layer 150;

Step S1016: sequentially forming a semiconductor oxide layer and a third metal layer on the active layer 160, and patterning the semiconductor oxide layer and the third metal layer respectively to form the gate insulating layer 171 and the gate electrode 172;

Step S1017: forming the passivation layer 180 on the gate insulating layer 171 and the gate electrode 172, wherein the passivation layer 180 covers the active layer 160, the gate insulating layer 171, and the gate electrode 172.

In addition, it should be noted that FIGS. 2a to 2f only show the structures related to the content of the embodiments of the present application, and the thin film transistor array substrate of the present application may further include other components for realizing the complete functions of the thin film transistor array substrate and/structure.

FIG. 2a shows the structure formed in the steps S1011 to S1012, including the substrate 110 and the first metal layer 120 positioned on the substrate 110. The substrate 110 may be a glass substrate, or may include a glass substrate and one or more layers of thin films on the glass substrate. One or more layers of thin films may be conductive thin films and/or functional thin films. After the substrate 110 is provided, a first metal layer may be formed on the substrate 110 through a deposition process. Then, the first metal layer can be patterned. For example, a photoresist layer (not shown in the figure) with a desired pattern is formed on the first metal material layer by a photolithography process, and an etching process is used to transfer the pattern on the photoresist layer to the first metal material layer. That is, according to the photoresist layer with the desired pattern, a part of the first metal material layer is etched and removed, and the remaining first metal material layer forms the first metal layer 120. A material of the first metal material layer may include any one or more of Molybdenum (Mo), Aluminum (Al), Copper (Cu), and Titanium (Ti). In addition, the material of the first metal material layer may further include Indium Tin Oxide (ITO), Indium Zinc Oxide (IZO) or Indium Gallium Zinc Oxide (IGZO). The first metal layer 120 can be used as a water vapor barrier layer to block water vapor in the environment. In addition, the first metal layer 120 may serve as a bottom light shielding layer of the thin film transistor.

FIG. 2b shows a structure formed in step S1013, including: a substrate 110, and a first metal layer 120, a first buffer layer 130, a source electrode 141 and a drain electrode 142 which are arranged on the substrate 110 in sequence. The source electrode 141 and the drain electrode 142 are provided in a same layer. The structure formed in step S1013 may further include the first electrode 143 and the second electrode 144 used in the MLED device.

Specifically, the first buffer layer 130 and the second metal layer can be respectively formed on the first metal layer 120 through a deposition process, and a part of the second metal layer is removed by patterning the second metal layer, and the remaining second metal layer forms the source electrode 141 and the drain electrode 142. The source electrode 141 and the drain electrode 142 are arranged at intervals. A material of the first buffer layer 130 may be Silicon Oxide (SiOx) or a stack of Silicon Nitride (SiNx) and Silicon Oxide (SiOx). A material of the second metal layer may include any one or more of Molybdenum (Mo), Aluminum (Al), Copper (Cu), and Titanium (Ti). In addition, the material of the second metal layer may further include Indium Tin Oxide (ITO), Indium Zinc Oxide (IZO) or Indium Gallium Zinc Oxide (IGZO).

FIG. 2c shows the structure formed in step S1014, including the substrate 110, and the first metal layer 120, the first buffer layer 130, the source electrode 141, the drain electrode 142, and the second buffer layer 150 which are arranged in sequence on the substrate 110.

Specifically, the second buffer layer 150 may be formed on the source electrode 141 and the drain electrode 142 through a deposition process. The step of forming the second buffer layer 150 may further include forming a plurality of openings 151 in the second buffer layer 150 by patterning. The plurality of openings 151 pass through part of the second buffer layer 150 and extend to the source electrode 141 and drain electrode 142 respectively. A material of the second buffer layer 150 may be Silicon Oxide (SiOx) or a stack of Silicon Nitride (SiNx) and Silicon Oxide (SiOx).

Figure 2D:
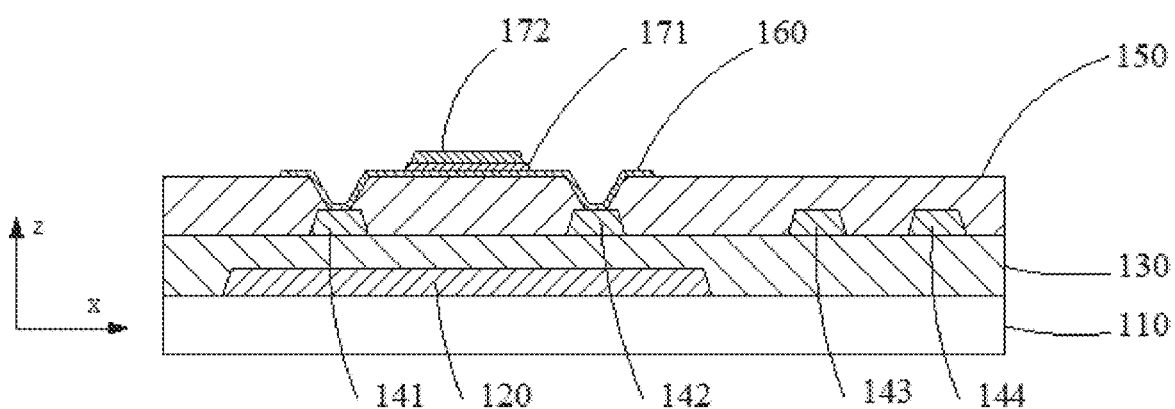

FIG. 2d shows the structure formed in steps S1015 and S1016, including: a substrate 110, and a first metal layer 120, a first buffer layer 130, a source electrode 141 and a drain electrode 142, a second buffer layer 150, an active layer 160, a gate insulating layer 171 and a gate electrode 172, which are sequentially disposed on the substrate 110.

Specifically, a semiconductor metal oxide layer (not shown in the figure) may be formed on the second buffer layer 150 through a deposition process, and then part of the semiconductor metal oxide layer may be removed by patterning the semiconductor metal oxide layer, to form the active layer 160. The step of forming the active layer 160 further includes performing plasma treatment on the remaining semiconductor metal oxide layer to respectively form a channel layer and a non-channel layer of the thin film transistor (not shown in the figure, such as the first conductor layer and second conductor layer). The active layer includes a channel layer 161 and a first conductor layer 162 and a second conductor layer 163 which are positioned on both sides of the channel layer 161.

The active layer 160 corresponding to the non-channel layer may connect to the first metal layer 120, the source electrode 141, and the drain electrode 142 through a through hole (not shown in the figure) formed in the first buffer layer 130 or the second buffer layer 150.

Specifically, after the active layer 160 is formed, an oxide layer and a third metal layer may be sequentially formed on the active layer 160 through a deposition process, and the oxide layer and the third metal layer may be patterned respectively. For example, the third metal layer is patterned to form the gate electrode 172, and the gate insulating layer 171 is patterned by the gate electrode 172 by self-alignment process, and part of the oxide layer is removed by etching, and the remaining oxide layer forms the gate insulating layer 171. The materials of the oxide layer and the gate insulating layer 171 may be oxides, such as silicon oxide (SiOx) and the like. The materials of the third metal layer and the gate electrode 172 may include any one or more of Molybdenum (Mo), Aluminum (Al), Copper (Cu), and Titanium (Ti). In addition, a material of the third metal layer may further include Indium Tin Oxide (ITO), Indium Zinc Oxide (IZO) or Indium Gallium Zinc Oxide (IGZO).

Figure 2E:
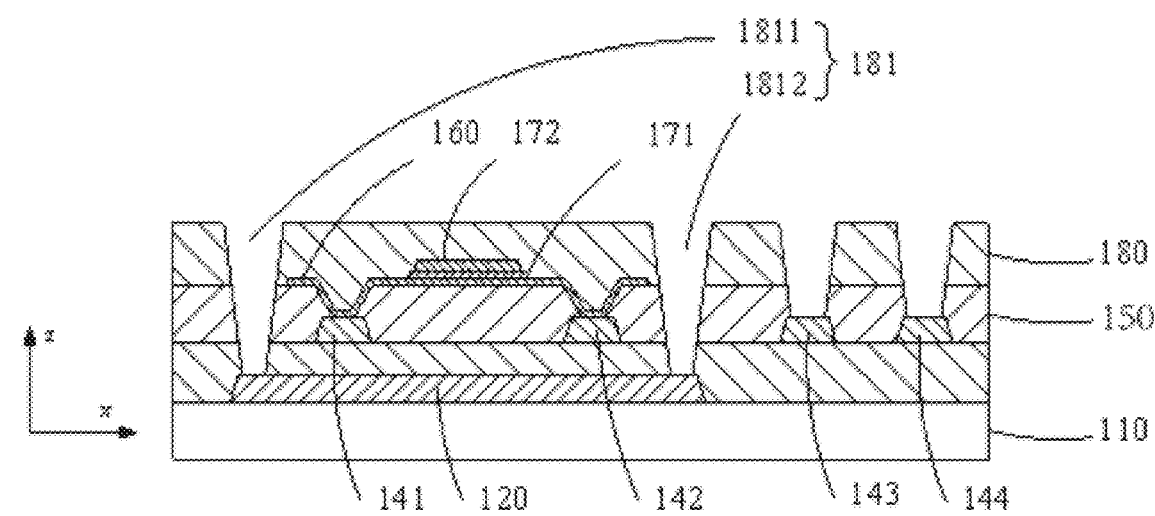

FIG. 2e shows the structure formed in step S1017, including: a substrate 110, a first metal layer 120 stacked on the substrate 110, a first buffer layer 130, a source electrode 141 and a drain electrode 142, a second buffer layer 150, an active layer 160, a gate insulating layer 171, a gate electrode 172, and a passivation layer 180. The passivation layer 180 covers the active layer 160, the gate insulating layer 171, and the gate electrode 172.

Specifically, a passivation layer 180 may be formed on the gate insulating layer 171 and the gate electrode 172 through a deposition process. The passivation layer 180 covers the active layer 160, the gate insulating layer 171, and the gate electrode 172. A material of the passivation layer 180 may be oxide, such as a stack of silicon oxide (SiOx), aluminum oxide (AlOx), silicon nitride (SiNx), and silicon oxide (SiOx).

Step S102: forming a fourth metal material layer on the passivation layer 180, and patterning the fourth metal material layer to form a fourth metal layer 190, wherein a projection of the gate electrode 172 on the substrate 110 is positioned in a projection of the fourth metal layer 190 on the substrate 110.

The step of forming the fourth metal layer 190 specifically includes:

An opening 181 is formed in the passivation layer 180, the opening 181 penetrates the passivation layer 180, the second buffer layer 150, and the first buffer layer 130, and extends to a side of the first metal layer 120 away from the first surface C1.

A fourth metal material layer is formed on the passivation layer 180, and the fourth metal material layer is patterned to form a fourth metal layer 190 and a connection electrode 182, wherein the connection electrode 182 is electrically connected to the fourth metal layer 190 and the first metal layer 120.

Figure 2F:
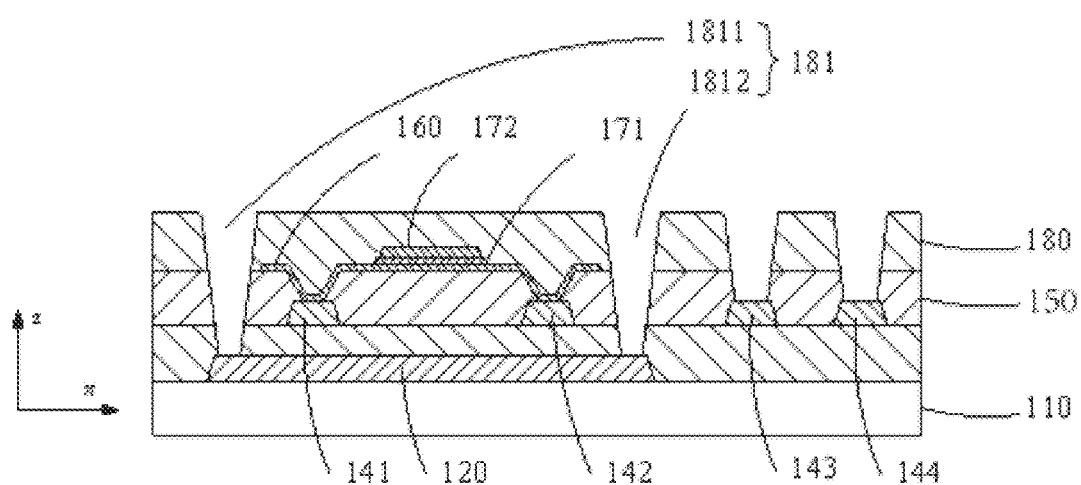

FIG. 2f shows a structure formed in step S102, including: the substrate 110, and the first metal layer 120, the first buffer layer 130, the source electrode 141 and the drain electrode 142, the second buffer layer 150, the active layer 160, the gate insulating layer 171, the gate electrode 172, the passivation layer 180, and the fourth metal layer 190 which are sequentially positioned on the substrate 110. The structure formed in step S102 further includes one or more connection electrodes 182. The connection electrode 182 penetrates through part of the passivation layer 180, the second buffer layer 150, and the first buffer layer 130, and extend to the first metal layer 120. That is, the connection electrode 182 connects the fourth metal layer 190 and the first metal layer 120.

Specifically, after the passivation layer 180 is formed on the gate insulating layer 171 and the gate electrode 172, one or more openings 181 may be formed in the passivation layer 180 by patterning. The opening 181 penetrates through the passivation layer 180, the second buffer layer 150, and the first buffer layer 130, and extends to a side of the first metal layer 120 away from the first surface C1. Then, a fourth metal material layer may be deposited on the passivation layer 180 through a deposition process, and the fourth metal material layer may be patterned to form the fourth metal layer 190 and the connection electrode 182. The metal material filled into the opening 181 forms a connection electrode 182. The connection electrode 182 penetrates through the passivation layer 180, the second buffer layer 150, and the first buffer layer 130, and extends to a side of the first metal layer 120 away from the first surface C1. That is, the fourth metal layer 190 and the first metal layer 120 are electrically connected through the connection electrode 182.

In a MLED display technology, the array substrate technology is the key technology for controlling the MLED display. In general, the current array substrate used for controlling MLED displays adopts 10mask technology, which greatly increases the cost of the array substrate and is not conducive to a mass production of MLED display technology. In embodiments of the present application, masks can be saved by patterning some structures together.

However, the current mask-reducing array substrates are prone to some problems. For example, the mask reduction technology usually involves forming metal layers positioned in different layers in the array substrate through a same mask. Correspondingly, the metal layers originally positioned in different layers are set in a same layer, therefore non-metallic film layers separating the metal layers are reduced, resulting in a decrease in an isolate water and oxygen ability of the array substrate. At the same time, the MLED array substrate does not have a bank layer and a planarization layer in the OLED array substrate, so that an influence of water and oxygen on the MLED array substrate is greater.

In addition, considering that the transfer of Micro/Mini-LED in the back-end is limited by a size of the array substrate, a product application needs to be cooperated with a seamless splicing technology, and the encapsulating of MLED array substrate cannot use a method of adding frame glue to the glass cover in OLED, so the encapsulating requirements of the array substrate itself are higher. In addition, although the low-hydrogen and other high-barrier inorganic passivation layers 180 made of aluminum oxide (AlOx) or titanium oxide (TiOx) have been used to improve the water and oxygen barrier capability of the array substrate. However, because it reacts with the material of the semiconductor active layer 160, it is easy to cause abnormal turning on of the TFT device.

Based on this, through the method of the embodiment of the present application, a fourth metal layer 190 is formed on the passivation layer 180, and the fourth metal layer 190 covers the gate electrode 172 in a direction (Z direction) perpendicular to the substrate 110. That is, the projection of the gate electrode 172 on the substrate 110 is positioned within the projection of the fourth metal layer 190 on the substrate 110. Thereby blocking an influence of water vapor in the environment on the metal layer in the array substrate, and avoids the corrosion of water vapor, thereby improving a product yield and a reliability of the display panel.

The fourth metal layer 190 is electrically connected to the first metal layer 120.

In addition, by forming the fourth metal layer 190, the fourth metal layer 190 is electrically connected to the first metal layer 120, the additional electric field of the induced electric field generated by the gate electrode 172 under the high voltage can be shielded, and the adhesion to the passivation layer due to the additional electric field can be avoided. The water vapor on the surface of 180 accelerates corrosion of the metal layer in the array substrate, thereby improving the product yield and the reliability of the panel. For example, there is usually hydrogen in the water vapor, and the hydrogen is easily entered into the thin film transistor under an action of an additional electric field, which accelerates a corrosion of the metal layer. By forming the fourth metal layer 190 covering the gate electrode 172 in the Z direction on the passivation layer 180, the accelerated corrosion of the metal layer by the hydrogen element due to the additional electric field can be improved.

In addition, the first metal layer 120 can serve as a water vapor barrier layer, and can also block corrosion of water vapor in the environment to a certain extent, thereby improving the product yield and the reliability of the display panel.

A projection of the active layer 160 on the substrate 110 is position within a projection of the fourth metal layer 190 on the substrate 110.

Specifically, by forming the fourth metal layer 190, the fourth metal layer 190 covers the channel layer and the non-channel layer of the active layer 160. That is, a projection of the active layer 160 on the substrate 110 is positioned in a projection of the fourth metal layer 190 on the substrate 110, an influence of water vapor in the environment can be further blocked, and corrosion of the water vapor can be avoided, thereby improving the product yield and the reliability of the panel. In addition, by forming the fourth metal layer 190 covering the channel layer and the non-channel layer in the Z direction, the accelerated corrosion of the metal layer by the additional electric field can be further improved.

The projection of the first metal layer 120 on the substrate 110 is positioned within the projection of the fourth metal layer 190 on the substrate 110.

Specifically, by forming the fourth metal layer 190, the fourth metal layer 190 covers the first metal layer 120 in a direction perpendicular to the substrate 110. That is, a projection of the first metal layer 120 on the substrate 110 is positioned in a projection of the fourth metal layer 190 of the substrate 110), to a certain extent, it can block an influence of water vapor in the environment on the metal layers such as the first metal layer 120, and avoid the corrosion of water vapor, thereby improving the product yield and the reliability of the display panel.

A number of the connection electrodes 182 is multiple, and the plurality of connection electrodes 182 are positioned on both sides of the fourth metal layer 190 respectively. The source electrode 141, the drain electrode 142, and the gate electrode 172 are surrounded by the plurality of connection electrodes 182, the first metal layer 120, and the fourth metal layer 190.

Specifically, in the embodiment of the present application, by forming the fourth metal layer 190 and the plurality of connection electrodes 182, the corresponding thin film transistor (TFT) of the source electrode 141 and the drain electrode 142 are surrounded by the plurality of connection electrodes 182, the first metal layer 120, and the fourth metal layer 190. That is, the source electrode 141, the drain electrode 142, and the gate electrode 172 are surrounded by the plurality of connection electrodes 182, the first metal layer 120, and the fourth metal layer 190, to completely block the influence of the water vapor in the environment, thereby improving the product yield and the reliability of the display panel. In addition, it is easy to generate an additional electric field of an inducing electric field when the gate electrode 172 in the array substrate is at a high electrical potential, and the additional electric field makes the water vapor molecules adsorbed on the surface of the passivation layer 180 easily enter the array substrate and accelerate the corrosion of the metal layer in the array substrate. The fourth metal layer 190 and the first metal layer 120 are connected together through the connecting electrode 182, which further shields the additional electric field and avoids accelerated corrosion by water vapor.

In addition, it should be noted that the connecting electrode 182 may also be one, and the fourth metal layer 190 and the first metal layer 120 are connected together through one connecting electrode 182 to further shield the additional electric field and avoid accelerated corrosion by water vapor.

In addition, it should be noted that any one of the thin film transistor array substrates formed by the methods of the embodiments of the present application may be a driving array substrate. The gate electrode 172 in the array substrate is usually at a high electrical potential when the thin film transistor array substrate is a driving array substrate, and an additional electric field that induces an electric field is easily generated. By shielding the additional electromagnetic, accelerated corrosion of the driving array substrate by water vapor is avoided, thereby improving the product yield and the reliability of the display panel.

Based on the method of manufacturing the array substrate described in the above embodiments of the present application, as shown in FIG. 2f, the present application provides a thin film transistor array substrate, including a substrate 110, a first metal layer 120 formed on a first surface C1 of the substrate 110, a first buffer layer 130 formed on a side of the first metal layer 120 away from the first surface C1, a second metal layer formed on the first buffer layer 130, wherein the second metal layer forms the source electrode 141 and the drain electrode 142 of the thin film transistor; a second buffer layer 150 formed on the second metal layer, an active layer 160 formed on the second buffer layer 150, wherein the active layer 160 includes a channel layer 161, and a first conductor layer 162 and a second conductor layer 163 which are positioned on both sides of the channel layer 161, a gate insulating layer 171 formed on the active layer 160, and the third metal layer formed on the gate insulating layer 171, wherein the third metal layer forms a gate electrode of the thin film transistor and a passivation layer 180 formed on the third metal layer. The array substrate further includes a fourth metal layer 190 formed on the passivation layer 180.

As shown in FIG. 2f, the thin film transistor array substrate may further include a first electrode 143 and a second electrode 144 used in the MLED device, such as a mini-LED device or a micro-LED device. One terminal of the MLED device is connected to the first electrode 143, and the other terminal of the MLED device is connected to the second electrode 144. The first electrode 143 may be an anode layer, the second electrode 144 may be a cathode layer, and the first electrode 143 and the second electrode 144 are formed by a second metal layer.

In one embodiment of the present application, a fourth metal layer 190 is formed on the passivation layer 180, and the fourth metal layer 190 covers the gate electrode 172 in a direction (Z direction) perpendicular to the substrate 110. That is, a projection of the gate electrode 172 on the substrate 110 is positioned in a projection of the fourth metal layer 190 on the substrate 110, which blocks the water vapor in the environment and avoids the corrosion of the water vapor, thereby improving the product yield and reliability of the display panel.

The fourth metal layer 190 is electrically connected to the first metal layer 120.

The thin film transistor array substrate also includes:
an opening 181 penetrating the passivation layer 180, the second buffer layer 150, and the first buffer layer 130, wherein the opening 181 extends to a side of the first metal layer 120 away from the first surface C1; and a connection electrode 182 formed in the opening 181, wherein the fourth metal layer 190 is connected to the first metal layer 120 through the connection electrode 182.

In addition, by forming the fourth metal layer 190, the fourth metal layer 190 is electrically connected to the first metal layer 120, an additional electric field of the induced electric field generated by the gate electrode 172 under the high voltage can be shielded, and prevent an accelerated corrosion of the metal layer in the array substrate caused by the water vapor attached to the surface of the passivation layer 180 due to the additional electric field, thereby improving the product yield and the reliability of the display panel.

In addition, the first metal layer 120 can serve as a water vapor barrier layer, and can also block corrosion of water vapor in the environment to a certain extent, thereby improving the product yield and the reliability of the panel.

A number of thin film transistors is multiple, and the plurality of thin film transistors distributed along the scanning line extending direction of the gate electrode 172 share the fourth metal layer 190 and/or share the first metal layer 120.

Specifically, the number of thin film transistors may be multiple, and the plurality of thin film transistors distributed along a scanning line extending direction of the gate electrode 172 (the direction perpendicular to the XZ plane, such as the Y direction) share the fourth metal layer 190. That is, the plurality of thin film transistors share the fourth metal layer 190 for blocking water vapor and as a top light shielding layer. In addition, the plurality of thin film transistors distributed along the scanning line extending direction of the gate electrode 172 (the direction perpendicular to the XZ plane, such as the Y direction) may also share the first metal layer 120. That is, the plurality of thin film transistors share the first metal layer 120 as the bottom shading layer.

The projection of the fourth metal layer 190 on the substrate 110 completely covers the projection of the active layer 160 on the substrate 110.

Specifically, in the embodiment of the present application, by forming the fourth metal layer 190, the fourth metal layer 190 covers a channel layer and a non-channel layer of the active layer 160. That is, a projection of the fourth metal layer 190 on the substrate 110 completely covering a projection of the active layer 160 on the substrate 110, which can further block the influence of water vapor in the environment and avoid water vapor corrosion, thereby improving the product yield and the reliability of the panel. In addition, by forming the fourth metal layer 190 covering the channel layer and the non-channel layer in the Z direction, the accelerated corrosion of the metal layer by the additional electric field can be further improved. In addition, the projection of the fourth metal layer 190 on the substrate 110 completely covers the projection of the active layer 160 on the substrate 110, so that the fourth metal layer 190 can be used as a top light shielding layer.

The projection of the fourth metal layer 190 on the substrate 110 completely covers the projection of the first metal layer 120 on the substrate 110.

Specifically, in the embodiment of the present application, by forming the fourth metal layer 190, the fourth metal layer 190 covers the first metal layer 120 in a direction perpendicular to the substrate 110. That is, a projection of the fourth metal layer 190 on the substrate 110 completely covers a projection of the first metal layer 120 on the substrate 110. To a certain extent, it can block an influence of water vapor in the environment on the metal layers such as the first metal layer 120, and avoid water vapor corrosion, thereby improving the product yield and the reliability of the display panel.

In addition, the projection of the first metal layer 120 on the substrate 110 completely covers the projection of the active layer 160 on the substrate 110, so that the first metal layer 120 can be used as a bottom light shielding layer.

The thin film transistor array substrate also includes:
a connection electrode 182 connected to the fourth metal layer 190 and the first metal layer 120.

Specifically, an additional electric field that induces an electric field is easily generated when the gate electrode 172 in the array substrate is at a high electrical potential, and the additional electric field makes the water vapor molecules adsorbed on the surface of the passivation layer 180 easily enter the array substrate and accelerate the corrosion of the metal layer of the array substrate. The fourth metal layer 190 and the first metal layer 120 are connected together through the connecting electrode 182 to shield the additional electric field and avoid accelerated corrosion of water vapor.

At least one thin film transistor includes a connection electrode 182, wherein the connection electrode 182 at least includes a first connection electrode 1821 positioned on a source electrode 141 side and a second connection electrode 1822 positioned on the drain electrode 142 side. The fourth metal layer 190 connects to the first metal layer 120 by the first connection electrode 1821 and the second connection electrode 1822, to surround the source electrode 141, the drain electrode 142, and the gate electrode 172.

Specifically, in the embodiment of the present application, by forming the fourth metal layer 190, the first connection electrode 1821 on the source electrode 141 side, and the second connection electrode 1822 on the drain electrode 142 side, the fourth metal layer 190 passes through the first connection electrode 1821 and the second connection electrode 1822 to connect the first metal layer 120 to surround the source electrode 141, the drain electrode 142, and the gate electrode 172. That is, the thin film transistor (TFT) corresponding to the source electrode 141, the drain electrode 142, and the gate electrode 172 are wrapped to completely block an influence of water vapor in the environment, further avoiding a corrosion of water vapor, thereby improving the product yield and the reliability of the display panel.

The thin film transistor array substrate further includes a first through hole 1811 and a second through hole 1812 penetrating the second buffer layer 150, wherein the first through hole 1811 and the second through hole 1812 exposes the source electrode 141 and the drain electrode 142, respectively. A first conductor layer 162 is connected to the source electrode 141 through the first through hole 1811. A second conductor layer 163 is connected to the drain electrode 142 through the second through hole 1812. That is, the first through hole 1811 corresponds to the first connection electrode 1821, the second through hole 1812 corresponds to the second connection electrode 1822, and the fourth metal layer 190 is connected to the first metal layer 120 through the first connection electrode 1821 and the second connection electrode 1822. The opening 181 includes a first through hole 1811 and a second through hole 1812.

In addition, it should be noted that the thin film transistor array substrate in any one of the embodiments of the present application may be a driving array substrate. The gate electrode 172 in the array substrate is usually at a high electrical potential when the array substrate is a driving array substrate, and an additional electric field of an inducing electric field is easily generated. Through the additional electromagnetic shielding generated by the water vapor molecules adsorbed on the surface of the passivation layer 180, accelerated corrosion of the driving array substrate by the water vapor is avoided, thereby improving the product yield and the reliability of the display panel.

In one embodiment of the present application, a number of connection electrodes 182 is multiple, a number of fourth metal layers 190 is multiple, and a number of thin film transistors is multiple, wherein the number of connection electrodes 182 and the number of fourth metal layers 190 are the same as the number of thin film transistors. Correspondingly, the plurality of connection electrodes 182 respectively electrically connect the fourth metal layer 190 to the corresponding thin film transistor.

Specifically, the number of connection electrodes 182, the number of fourth metal layers 190 and the number of thin film transistors may be multiple, wherein the number of connection electrodes 182 and the number of fourth metal layers 190 are correspond to the number of thin film transistors. For example, the number of thin film transistors and the fourth metal layer 190 is N, that is, the fourth metal layer can be used as a top light shielding layer of a corresponding thin film transistor, and a protective layer for shielding electric fields and blocking water vapor. The number of connection electrodes 182 can be a multiple of N, such as 2N. At this time, two connection electrodes 182, such as the first connection electrode 1821 and the second connection electrode 1822 are respectively positioned at the two edges of the fourth metal layer 190 to electrically connect the fourth metal layer 190 with the corresponding first metal layer 120, to achieve an effect that blocking the water vapor on the film layer in the thin film transistor.

The plurality of connection electrodes 182 distributed along the scanning line extending direction of the gate electrode and corresponding to adjacent thin film transistors are alternately distributed along the scanning line extending direction of the gate electrode 172.

Specifically, the number of connection electrodes 182, the number of fourth metal layers 190, and the number of thin film transistors may be multiple, wherein the number of connection electrodes 182 and the number of fourth metal layers 190 correspond to the number of thin film transistors. For example, both the number of thin film transistors and the fourth metal layer 190 are N. That is, one fourth metal layer 190 is used as a top light shielding layer and a protective layer for shielding electric field and water vapor of the corresponding thin film transistor. The number of the connection electrode 182 can be a multiple of N, such as N. At this time, one connection electrode 182 is positioned on one of the two edges of the fourth metal layer 190. For example, the plurality of connection electrodes 182 distributed along the scanning line extending direction of the gate electrode 172 and corresponding to adjacent thin film transistors are staggered along the extending direction of the scanning line of the gate electrode 172 (the connection electrodes 182 corresponding to the adjacent thin film transistors are respectively staggered on the left and right sides of the fourth metal layer 190), thereby prevent water vapor from affecting the film layer in the thin film transistor.

It should be understood that the thin film transistor array substrate of the embodiments of the present application and the structure and fabrication process of each component forming the thin film transistor array substrate may refer to the above embodiments of the manufacturing method of the thin film transistor array substrate, which will not be repeated here.

Based on the thin film transistor array substrate and the manufacturing method thereof described in the above embodiments of the present application, the present application further provides a display panel. The display panel includes: a display device and the thin film transistor array substrate according to any one of the above, the thin film transistor array substrate further includes a first electrode 143 and a second electrode 144 formed of by the second metal layer.

Specifically, by using the display panel including the thin film transistor array substrate according to any one of the embodiments of the present application, the fourth metal layer 190 is formed on the passivation layer 180. The fourth metal layer 190 cover the gate electrode 172 in a direction (Z) perpendicular to the substrate 110. That is, a projection of the fourth metal layer 190 on the substrate 110 completely covering a projection of the gate electrode 172 on the substrate 110, to block an influence of water vapor in the environment on the metal layer in the array substrate, and to avoid water vapor corrosion, thereby improving the product yield and the reliability of the display panel.

The display device includes a mini-LED device and/or a micro-LED device, wherein one terminal of the mini-LED device and/or the micro-LED device is connected to the first electrode, and the other terminal of the mini-LED device and/or the micro-LED device is connected to the second electrode.

Specifically, the display device in the display panel is not particularly limited, as long as the display device can function as a display. For example, the display device may be a mini-LED device, a micro-LED device, or an OLED device.

According to the above, the present application provides a thin film transistor array substrate and a display panel. The thin film transistor array substrate includes a substrate, a first metal layer formed on a first surface of the substrate, a first buffer layer formed on a side of the first metal layer away from the first surface, a second metal layer formed on the first buffer layer, wherein the second metal layer forms the source electrode and the drain electrode of the thin film transistor, a second buffer layer formed on the second metal layer, an active layer formed on the second buffer layer, wherein the active layer includes a channel layer, and a first conductor layer and a second conductor layer on both sides of the channel layer; a gate insulating layer formed on the active layer, and a third metal layer formed on the gate insulating layer, wherein the third metal layer forms a gate electrode of the thin film transistor, a passivation layer formed on the third metal layer, and a fourth metal layer formed on the passivation layer. By arranging the fourth metal layer on the passivation layer, an influence of water vapor in the environment on the array substrate is blocked, thereby improving the product yield and the reliability of the panel.

The above descriptions are only preferred embodiments of the present application and are not intended to limit the present application. Any modification, equivalent replacement and improvement made within the spirit and principle of the present invention shall be included within a protection scope of the present application.

What is claimed is:

1. A thin film transistor array substrate, comprising:
   a substrate;
   a first metal layer formed on a first surface of the substrate;
   a first buffer layer formed on a side of the first metal layer away from the first surface;
   a second metal layer formed on the first buffer layer, wherein the second metal layer forms a source electrode and a drain electrode of at least one thin film transistor;
   a second buffer layer formed on the second metal layer;
   an active layer formed on the second buffer layer, wherein the active layer comprises a channel layer, and a first conductor layer and a second conductor layer on both sides of the channel layer;
   a gate insulating layer formed on the active layer, and a third metal layer formed on the gate insulating layer, wherein the third metal layer forms a gate electrode of the thin film transistor;
   a passivation layer formed on the third metal layer; and
   a fourth metal layer formed on the passivation layer;
   wherein the fourth metal layer is electrically connected to the first metal layer.

2. The thin film transistor array substrate according to claim 1, wherein the thin film transistor array substrate further comprises a first through hole and a second through hole penetrating the second buffer layer;
   wherein the first through hole and the second through hole respectively exposing the source electrode and the drain electrode, wherein the first conductor layer is connected to the source electrode through the first through hole, and wherein the second conductor layer is connected to the drain electrode through the second through hole.

3. The thin film transistor array substrate according to claim 1, wherein a projection of the first metal layer on the substrate completely covers a projection of the active layer on the substrate, and wherein a projection of the fourth metal layer on the substrate completely covers the projection of the first metal layer on the substrate.

4. The thin film transistor array substrate according to claim 1, wherein the thin film transistor array substrate further comprises:
   an opening penetrating through the passivation layer, the second buffer layer, and the first buffer layer, wherein the opening extends to a side of the first metal layer facing away from the first surface; and
   a connection electrode formed in the opening;
   wherein the fourth metal layer is connected to the first metal layer through the connection electrode.

5. The thin film transistor array substrate according to claim 4, wherein at least one of the at least one thin film transistor comprises the connection electrode, and wherein the connection electrode at least comprises:
   a first connection electrode positioned on a source electrode side; and
   a second connection electrode positioned on a drain electrode side;
   wherein the fourth metal layer is connected to the first metal layer through the first connection electrode and the second connection electrode, to surround the source electrode, the drain electrode, and the gate electrode.

6. The thin film transistor array substrate according to claim 1, wherein the at least one thin film transistor comprises a plurality of thin film transistors, and wherein the plurality of thin film transistors distributed along an extending direction of a scanning line of the gate electrode share the fourth metal layer, and/or share the first metal layer.

7. The thin film transistor array substrate according to claim 6, wherein the plurality of the connection electrodes corresponding to adjacent thin film transistors distributed along the extending direction of the scanning line of the gate electrode are staggered and distributed along the extending direction of the scanning line of the gate electrode.

8. A display panel, wherein the display panel comprises a display device and a thin film transistor array substrate, wherein the thin film transistor array substrate further comprises a first electrode and a second electrode formed by the second metal layer;
wherein the thin film transistor array substrate comprises:
a substrate;
a first metal layer formed on a first surface of the substrate;
a first buffer layer formed on a side of the first metal layer away from the first surface;
a second metal layer formed on the first buffer layer, wherein the second metal layer forms a source electrode and a drain electrode of at least one thin film transistor;
a second buffer layer formed on the second metal layer;
an active layer formed on the second buffer layer, wherein the active layer comprises a channel layer, and a first conductor layer and a second conductor layer on both sides of the channel layer;
a gate insulating layer formed on the active layer, and a third metal layer formed on the gate insulating layer, wherein the third metal layer forms a gate electrode of the thin film transistor;
a passivation layer formed on the third metal layer; and
a fourth metal layer formed on the passivation layer;
wherein the fourth metal layer is electrically connected to the first metal layer.

9. The display panel according to claim 8, wherein the display device comprises a mini-LED device and/or a micro-LED device, wherein one terminal of the mini-LED device and/or one terminal of the micro-LED device is connected to the first electrode, and wherein the other terminal of the mini-LED device and/or the other terminal of the micro-LED device is connected to the second electrode.

10. The display panel according to claim 8, wherein the thin film transistor array substrate further comprises:
an opening penetrating through the passivation layer, the second buffer layer, and the first buffer layer, wherein the opening extends to a side of the first metal layer facing away from the first surface; and
a connection electrode formed in the opening;
wherein the fourth metal layer is connected to the first metal layer through the connection electrode.

11. The display panel according to claim 8, wherein at least one of the at least one thin film transistor comprises the connection electrode, and wherein the connection electrode at least comprises:
a first connection electrode positioned on a source electrode side; and
a second connection electrode positioned on a drain electrode side;
wherein the fourth metal layer is connected to the first metal layer through the first connection electrode and the second connection electrode, to surround the source electrode, the drain electrode, and the gate electrode.

12. The display panel according to claim 8, wherein the thin film transistor array substrate further comprises a first through hole and a second through hole penetrating the second buffer layer;
wherein the first through hole and the second through hole respectively exposing the source electrode and the drain electrode, wherein the first conductor layer is connected to the source electrode through the first through hole, and wherein the second conductor layer is connected to the drain electrode through the second through hole.

13. The display panel according to claim 8, wherein a projection of the first metal layer on the substrate completely covers a projection of the active layer on the substrate, and wherein a projection of the fourth metal layer on the substrate completely covers the projection of the first metal layer on the substrate.

14. The display panel according to claim 8, wherein the at least one thin film transistor comprises a plurality of thin film transistors, and wherein the plurality of thin film transistors distributed along an extending direction of a scanning line of the gate electrode share the fourth metal layer, and/or share the first metal layer.

15. The display panel according to claim 14, wherein the plurality of the connection electrodes corresponding to adjacent thin film transistors distributed along the extending direction of the scanning line of the gate electrode are staggered and distributed along the extending direction of the scanning line of the gate electrode.

* * * * *